United States Patent
Nitzan et al.

(10) Patent No.: US 7,411,844 B2
(45) Date of Patent: Aug. 12, 2008

(54) SEMICONDUCTOR MEMORY DEVICE HAVING A REDUNDANCY INFORMATION MEMORY DIRECTLY CONNECTED TO A REDUNDANCY CONTROL CIRCUIT

(75) Inventors: Ifat Nitzan, Petach Tiqva (IL); Nimrod Ben-Ari, Natanya (IL)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 148 days.

(21) Appl. No.: 11/291,081

(22) Filed: Nov. 30, 2005

(65) Prior Publication Data
US 2007/0121396 A1    May 31, 2007

(51) Int. Cl.
*G11C 29/44* (2006.01)
(52) U.S. Cl. .................. 365/200; 365/201; 365/190; 365/189.02; 365/230.03; 365/185.09; 365/185.23; 365/185.11
(58) Field of Classification Search ............... 365/200, 365/201, 230.03, 190, 205, 189.02, 185.09, 365/185.11, 185.23
See application file for complete search history.

(56) References Cited

U.S. PATENT DOCUMENTS

| 6,246,616 | B1 | 6/2001 | Nagai et al. ................. 365/200 |
| 6,421,285 | B2 | 7/2002 | Matsuzaki et al. ........... 365/200 |
| 6,625,063 | B2 * | 9/2003 | Kim ....................... 365/185.28 |
| 6,967,879 | B2 * | 11/2005 | Mizukoshi .................. 365/200 |
| 7,102,942 | B2 * | 9/2006 | Park ............................. 365/200 |
| 7,116,590 | B2 * | 10/2006 | Blodgett ..................... 365/200 |
| 7,274,597 | B2 * | 9/2007 | Srowik et al. ........... 365/185.18 |

* cited by examiner

*Primary Examiner*—Andrew Q Tran
(74) *Attorney, Agent, or Firm*—Slater & Matsil, L.L.P.

(57) ABSTRACT

A semiconductor memory device (M) includes a memory array (MA) having a plurality of memory cells, a redundancy array (RA) having a plurality of memory cells, a non-volatile redundancy information memory (NVR) having a plurality of memory cells for storing redundancy information, and a redundancy control unit (RU) for selecting either memory cells in the memory array (MA) or memory cells in the redundancy array (RA). In one example, the non-volatile redundancy information memory (NVR) is connected directly to the redundancy control unit (RU) by means of at least one sense amplifier (SA).

20 Claims, 4 Drawing Sheets

SEMICONDUCTOR MEMORY DEVICE HAVING A REDUNDANCY INFORMATION MEMORY DIRECTLY CONNECTED TO A REDUNDANCY CONTROL CIRCUIT

TECHNICAL FIELD

The present invention relates to a semiconductor memory device and also concerns a method for operating such a semiconductor memory device.

BACKGROUND

As the storage capacity of semiconductor memory devices continues to increase, the number of memory cells included in such memories also increases. With the increase in the number of memory cells, the probability that one or more memory cells are defective is increased. In order to avoid having to discard the memory device due to just one or a few defective memory cells, redundant memory elements are included in the semiconductor memory device. The redundant memory elements are usually rows and/or columns and are used to replace the rows and/or columns that contain defective memory cells.

During wafer testing, all memory cells are tested. The information about which memory cells are defective and sometimes the information about which redundant memory elements are selected to replace the defective memory elements is called redundancy information. After the wafer test the redundancy information is stored in a non-volatile memory in a one-time programming (OTP) operation. During read, write or erase operations, the memory device addresses memory cells. A redundancy control unit accesses the redundancy information to check if the memory cells addressed are functioning or if they need to be replaced by a redundant element. If they are defective, the memory cells will be replaced with redundant elements. As a result, the semiconductor memory device will function as expected and the production yield is significantly increased.

FIG. 1 shows a semiconductor memory device M. The semiconductor memory device M comprises a memory array MA for storing user data, a redundancy array RA providing redundant memory elements, and a non-volatile redundancy information memory NVR for storing redundancy information. The memory cells in the memory array MA and the non-volatile redundancy information memory NVR can be read by means of the sense amplifier SA and written by means of the bitline driver BL while the memory cells in the redundancy array RA can be read by means of the redundancy array sense amplifier RSA and written by means of the redundancy array bitline driver RBL. A bitline multiplexer BLM is used to connect the data bus DB to either the bitline driver BL or to the redundancy array bitline driver RBL, while a sense amplifier multiplexer SAM is used to connect either the sense amplifier SA or the redundancy array sense amplifier RSA to the data bus DB. Both the bitline multiplexer BLM and the sense amplifier multiplexer SAM are controlled by the redundancy control unit RU.

FIG. 1 shows the flow of the redundancy information during power up or during initialization of the semiconductor memory device M. The elements involved are drawn using thicker lines. Memory cells in the non-volatile redundancy information memory NVR are selected by means of the address decoder AD and the redundancy information stored is read by means of the sense amplifier SA. The redundancy control unit RU controls the sense amplifier multiplexer SAM so that the sense amplifier SA is connected to the data bus DB.

The redundancy information is then transferred by means of the data bus DB to the redundancy information memory RM. The redundancy information memory RM is usually a static random access memory (SRAM), which allows for fast access of the information stored in it.

FIG. 2 shows the same semiconductor memory device M as in FIG. 1 and illustrates the flow of the redundancy information when memory cells are accessed, such as during read, write, or erase operations. The data path of the redundancy information is again indicated by using thicker lines for the elements involved. Every time a memory cell is accessed, the redundancy information corresponding to the address of the memory cell accessed, is read from the redundancy information memory RM into the redundancy decoder RD, where it is decoded. The redundancy information is then transferred by means of the data bus DB to the redundancy control unit RU. The redundancy control unit RU controls the bitline driver multiplexer BLM and the sense amplifier multiplexer SAM, so that depending on the redundancy information, either a memory cell in the memory array MA or a memory cell in the redundancy array RA is accessed.

The semiconductor memory device M suffers from a number of disadvantages. First, the redundancy information has to be read out of the redundancy information memory RM, decoded by the redundancy decoder RD and then loaded into the redundancy control unit RU every time before a memory cell can be accessed. For these steps, a total number of about twenty clock cycles is necessary, which slows down the access to the memory cells and leads to poor performance. Second, both the redundancy information memory RM and the redundancy decoder RD require chip area. At present, the required chip area amounts to 1.5 mm².

SUMMARY OF THE INVENTION

Therefore, in one aspect, the present invention provides an improved semiconductor memory device in which the chip area required for the redundancy system is reduced and the access performance of the semiconductor memory device is improved. In a further aspect, the invention provides a method for operating such a semiconductor memory device.

Accordingly, there is provided a semiconductor memory device comprising a memory array having a plurality of memory cells, a redundancy array having a plurality of memory cells, a non-volatile redundancy information memory having a plurality of memory cells for storing redundancy information, and a redundancy control unit for selecting either memory cells in the memory array or memory cells in the redundancy array, wherein the non-volatile redundancy information memory is connected directly to the redundancy control unit by means of at least one sense amplifier.

There is further provided that the memory cells of the memory array and the memory cells of the redundancy array are arranged in columns.

There is further provided that the number of memory cells in the non-volatile redundancy information memory is greater than or equal to the number of columns of memory cells in the memory array.

There is further provided that each memory cell in the non-volatile redundancy information memory is connected to the redundancy control unit by means of a respective sense amplifier.

There is further provided that the non-volatile redundancy information memory is part of the memory array.

There is further provided that the memory cells in each column of the memory array are connected to a same sense amplifier as the at least one corresponding memory cell of the non-volatile redundancy information memory.

There is further provided that the redundancy control unit is connected to the control inputs of at least one bitline driver multiplexer and to the control inputs of at least one sense amplifier multiplexer. The at least one bitline driver multiplexer connects a data bus to either a bitline driver of the memory array or to a bitline driver of the redundancy array. The at least one sense amplifier multiplexer connects either a sense amplifier of the memory area or a sense amplifier of the redundancy array to the data bus.

There is further provided that at least the memory cells of one of the memory array, the redundancy array and the non-volatile redundancy information memory are nitride read-only memory cells (NROM).

There is still further provided a method for operating a semiconductor memory device. The method comprises the steps of providing a memory array having a plurality of memory cells, a redundancy array having a plurality of memory cells, a non-volatile redundancy information memory having a plurality of memory cells for storing redundancy information, and a redundancy control unit, receiving an address, reading the redundancy information stored in the non-volatile redundancy information memory directly into the redundancy control unit by means of at least one sense amplifier, and selecting either a memory cell in the memory array or a memory cell in the redundancy array for one of a read, write and erase operation by means of the redundancy control unit and depending on the redundancy information that corresponds to the address received.

There is further provided that in the step of reading the redundancy information, the redundancy information is read out of the memory cells of the non-volatile redundancy information memory in parallel by respective sense amplifiers.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

The invention will now be described in more detail below by way of non-limiting embodiments and with reference to the accompanying drawings in which.

Figure 1:
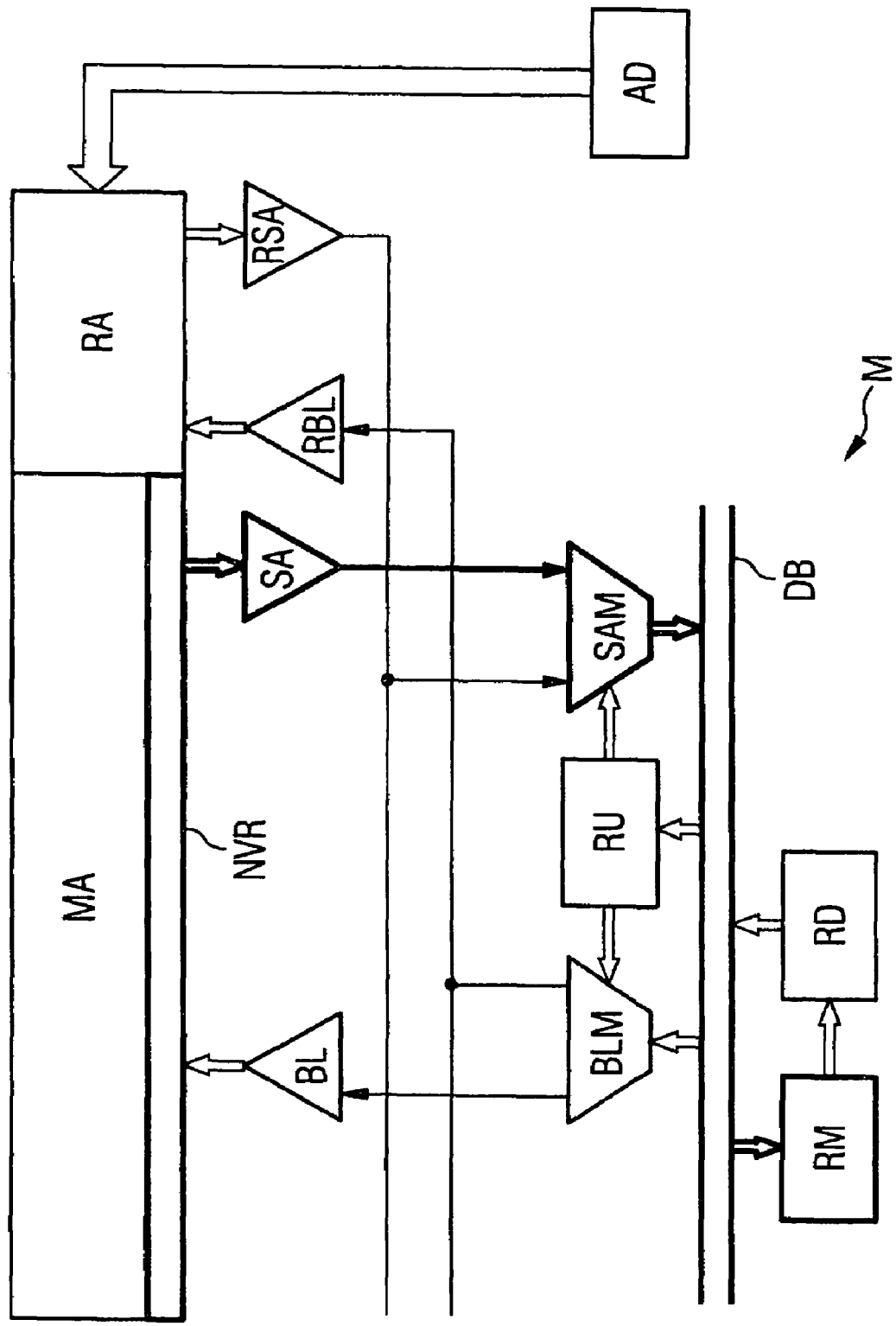
FIG. 1 illustrates the flow of redundancy information during power up for a redundancy system.

The following reference numerals correspond to the figures:

| | |
|---|---|
| AD | address decoder |
| BL | memory array bitline driver |
| BLM | bitline driver multiplexer |
| DB | data bus |
| M | semiconductor memory device |
| MA | memory array |
| NVR | non-volatile redundancy info. memory |
| RA | redundancy array |
| RBL | redundancy array bitline driver |
| RD | redundancy information decoder |
| RM | redundancy information memory |

-continued

| | |
|---|---|
| RSA | redundancy array sense amplifier |
| RU | redundancy control unit |
| SA | memory array sense amplifier |
| SAM | sense amplifier multiplexer |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

An embodiment of the present invention will be described in detail below with reference to the accompanying drawings.

Figure 3:
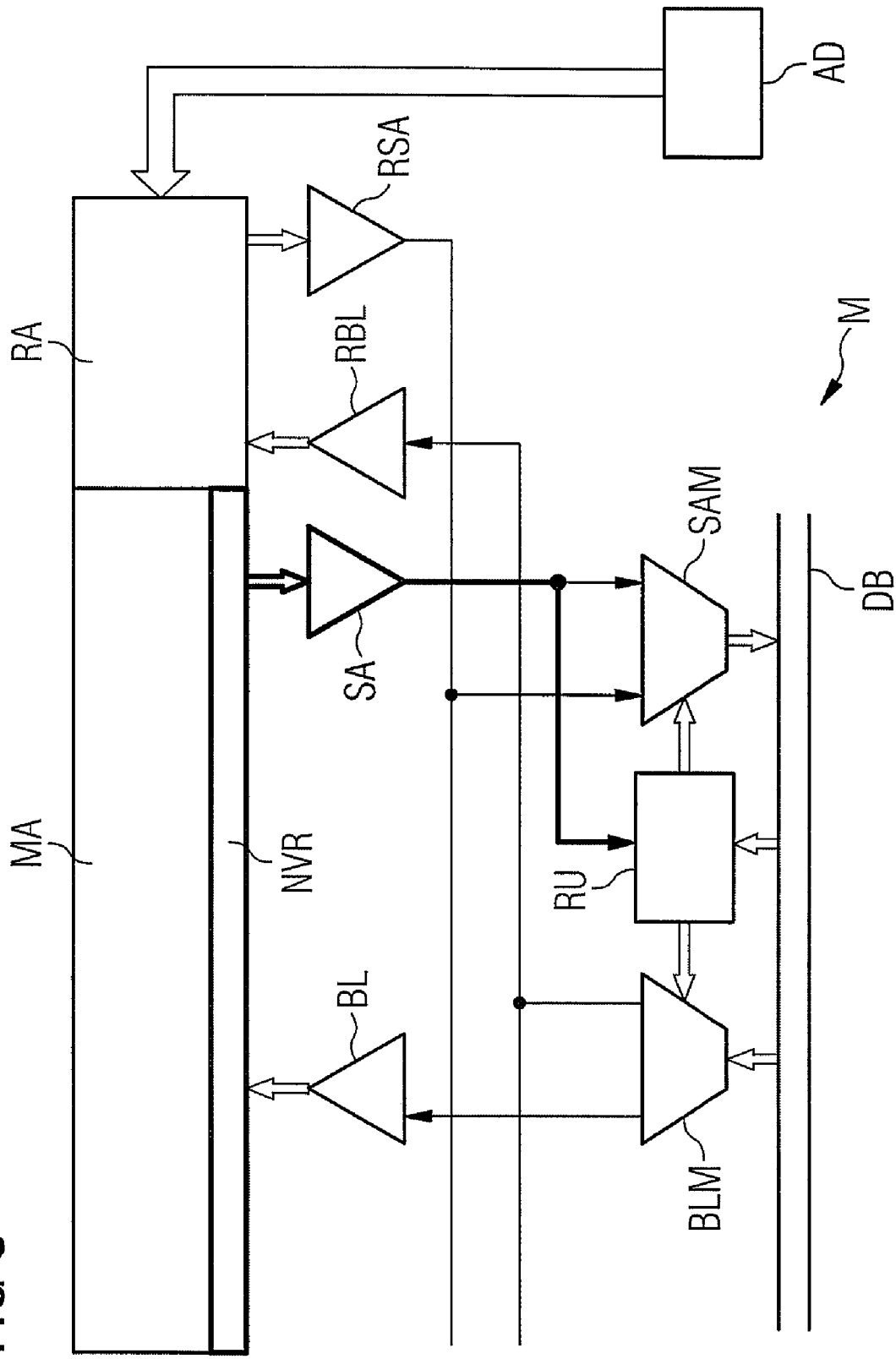
FIG. 3 illustrates an embodiment of the invention.

FIG. 3 illustrates an embodiment according to the invention. The semiconductor memory device M comprises a memory array MA, a redundancy array RA, and a non-volatile redundancy information memory NVR. The three memories may be separate and implemented in different memory technologies. However, it is advantageous if they are of the same memory type as they can be manufactured and integrated together and share the same I/O peripherals.

By connecting the memory cells in each column of the memory array MA and the corresponding memory cells of the non-volatile redundancy information memory NVR to a same sense amplifier SA, the complexity of the semiconductor memory device can be reduced. Also, the same wordline decoder and bitline decoder can be employed.

The memory cells in the memory areas may, for example, be NROM (nitride read-only memory) or floating gate memory cells. Nitride read-only memory cells are able to store two bits in one memory cell so that they can be used to increase the storage capacity of semiconductor memory devices.

If the non-volatile redundancy information memory NVR is to be integrated together with the memory array MA and the redundancy array RA, the memory cells in those memories should be non-volatile. If this is not the case, the memory cells of the memory array MA and the redundancy array RA may be volatile. The non-volatile redundancy information memory NVR may consist of any kind of non-volatile memory cells.

During a wafer test, the memory cells in the memory array MA are tested. Redundancy information regarding the memory cells in the memory array MA are stored in the non-volatile redundancy information memory NVR. This is usually only done once during the lifetime of the semiconductor memory device M, which is why it is also referred to as one-time programming (OTP). The redundancy information is available to the semiconductor memory device M during its life cycle and is usually only read. Alternatively, the redundancy information may, for example, be updated after detecting a failure during a periodical self-test.

By providing at least one memory cell in the non-volatile redundancy information memory NVR for each column of memory cells in the memory array MA, redundancy information for each of the columns in the memory array can be stored. The redundancy information may contain a single bit value such as the value "0" or "1" or, for example, identification information, such as the number of a redundancy elements in the redundancy array RA. The bit value "0" may be used to indicate that the memory element selected in the memory array MA is functioning and can be used, while a bit value of "1" is used to indicate that the memory cell selected in the memory array MA is defective and a replacement memory cell from the redundancy array RA has to be used. If the memory cells in the memory array MA and in the redundancy array RA are arranged in columns, the redundancy information stored in the non-volatile redundancy information memory NVR may be used to indicate which column of the redundancy array RA is used to replace the column in the memory array MA, which contains the defective memory cell. The advantage of using column redundancy is that statically there are more single cell defects and using row redundancy is more wasteful.

The assignment of the redundancy element may be done automatically, for example, sequentially, or if more information is stored, explicitly.

Memory cells in the memory area MA and the non-volatile redundancy information memory NVR are read by using at least one sense amplifier SA while memory cells in the redundancy array RA are read using at least one redundancy array sense amplifier RSA. For writing operations, memory cells in the memory array MA are written by means of at least one memory array bitline driver BL while the memory cells in the redundancy array RA are written by means of at least one redundancy array bitline driver RBL.

A bitline driver multiplexer BLM is used to select either the memory array bitline driver BL or the redundancy array bitline driver RBL. If, for example, the value "0" is stored in the redundancy information, the data on the data bus DB is written to the corresponding memory cell in the memory array MA. In some embodiments, the memory cells in the non-volatile redundancy information memory NVR are never written after the OTP. The sense amplifier multiplexer SAM is used to select either the memory array sense amplifier SA or the redundancy array sense amplifier RSA for outputting data to the data bus DB. If, for example, the redundancy information contains the value "1" data will be read from the corresponding memory cell in the redundancy array RA and transferred to the data bus DB.

During operation, the redundancy control unit RU controls the bitline driver multiplexer BLM and the sense amplifier multiplexer SAM. The redundancy control unit RU has two inputs. First, the redundancy information stored in the non-volatile redundancy information memory NVR and read by means of the memory array sense amplifier SA and second, the address information for addressing a memory cell from the data bus DB. The redundancy control unit RU usually comprises a column decoder for selecting columns of memory cells in the memory array MA or the redundancy array RA, even though it is possible to use a column decoder within the sense amplifiers SA and RSA and the bitline drivers BL and RBL. The address information of the memory cell is also supplied to the address decoder AD, which acts as a row decoder and selects the wordline of the memory cell that is to be addressed.

It is advantageous if, for each of the columns of memory cells in the memory array MA, a respective memory array sense amplifier SA is provided. In this way, the redundancy information stored in the non-volatile redundancy information memory NVR can be read in parallel and simultaneously by the redundancy control unit RU so that no decoding of the redundancy information is required. However, embodiments having less memory array sense amplifiers SA than columns in the memory array MA are conceivable. In those cases, the redundancy control unit RU would need to control additional multiplexers to read out the required information. If the redundancy information consists of only one bit, the redundancy control unit RU will allocate the corresponding columns in the redundancy array RA by itself. If more than one bit is available for storing redundancy information of each column in the memory array MA, then the number of a specific column in the redundancy array RA may be stored in the non-volatile redundancy information memory NVR.

In contrast to prior art, the redundancy information stored in the non-volatile redundancy information memory NVR is read directly into the redundancy control unit RU by means of the memory array sense amplifiers SA. Comparing FIG. 3 with FIGS. 1 and 2, it is apparent that no redundancy information decoder RD and no redundancy information memory RM is needed. Consequently, the chip area required for the semiconductor memory device M is reduced.

As the redundancy information is read in parallel and simultaneously by the sense amplifiers SA, no decoding is needed. Only two to four clock cycles are needed to implement this redundancy concept so that the read, write, and erase operations are greatly accelerated.

Figure 2:
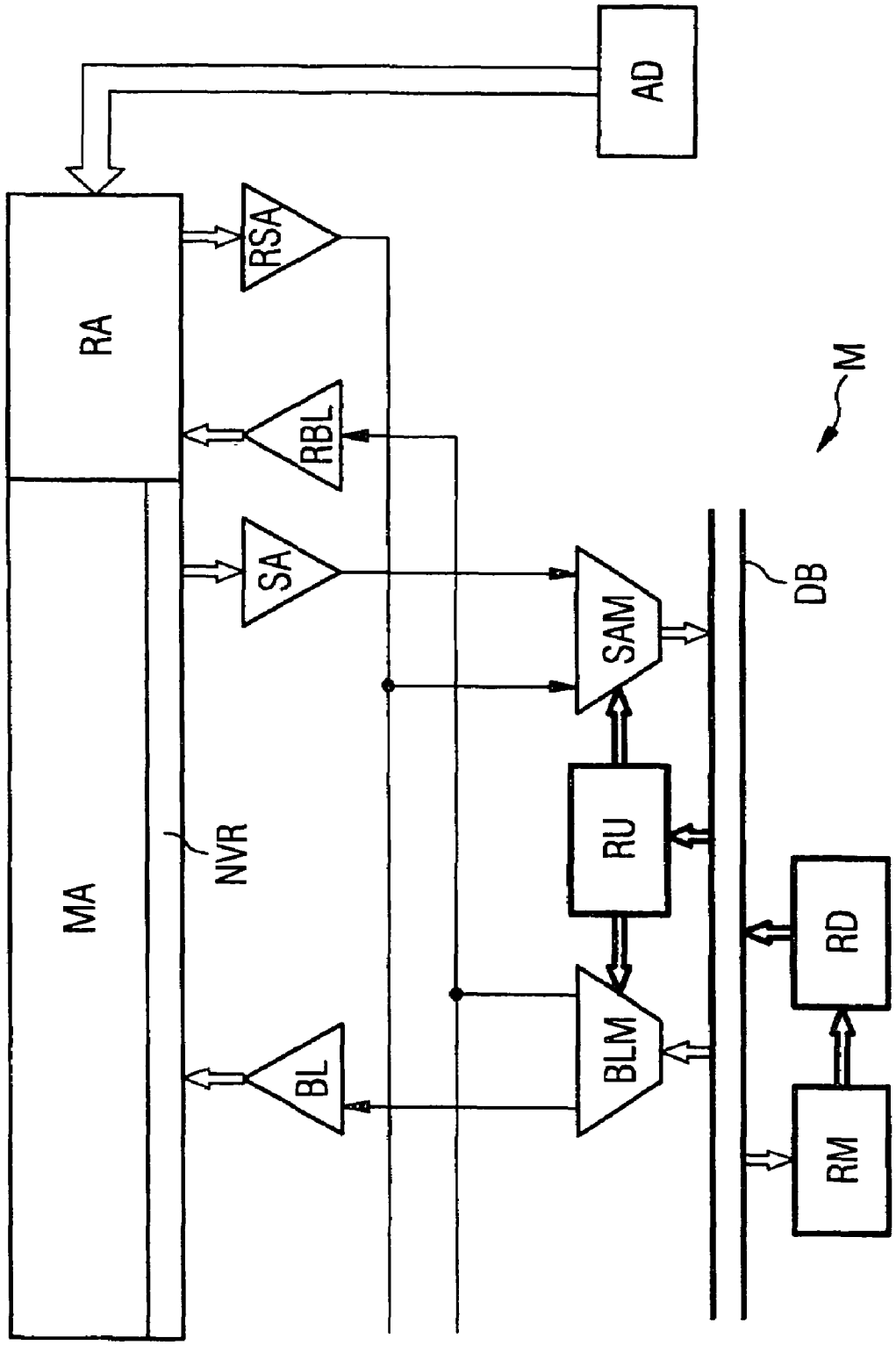
FIG. 2 illustrates the flow of redundancy information during the operation of a redundancy system.

Further, as there is no need to load the redundancy information from the non-volatile redundancy information memory NVR into the redundancy memory RM, as was shown in FIG. 1, power up and initialization of the semiconductor memory device M will be faster.

Further, the first bit latency, which is the time between giving the read command and getting the first bit of data out of the semiconductor memory device M, is reduced.

Still further, a redundancy system that does not require a redundancy information memory RM and a redundancy information decoder RD allows for simpler redundancy management and leads to more robust semiconductor memory devices.

Figure 4:
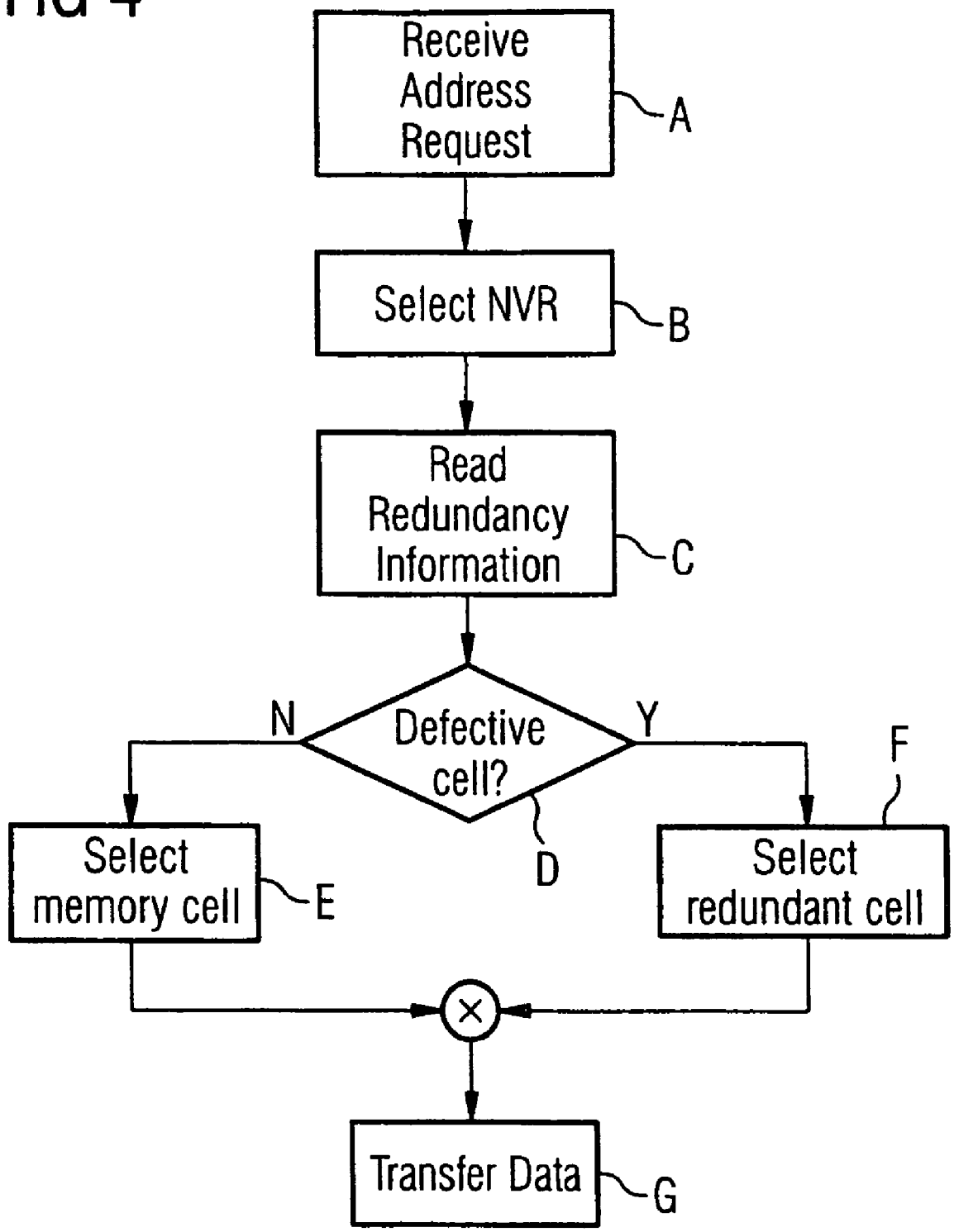
FIG. 4 illustrates a method for operating a semiconductor memory device in accordance with the invention.

FIG. 4 illustrates an example of how the semiconductor memory device M shown in FIG. 3 may be operated. The flow chart shows steps that can be performed before each write, read, and erase operation.

In step A, an address request is received by the semiconductor memory device M by means of the data bus DB. The address determines which memory cell in the memory array MA is to be operated on.

In step B, the non-volatile redundancy information memory NVR is selected by applying the required reading voltage to the wordline that is connected to the gates of its memory cells. This may be done by the address decoder AD. The non-volatile redundancy information memory NVR can be a row of memory cells in the memory array MA.

In step C, the redundancy information stored in the non-volatile redundancy information memory NVR is read directly using the memory array sense amplifiers SA into the redundancy control unit RU. In contrast to prior art, the redundancy information is not transferred over the data bus DB or the sense amplifier multiplexer SAM, but rather is read in parallel and simultaneously, and because each memory cell of the non-volatile redundancy information memory NVR contains the redundancy information for the corresponding column no decoding is required.

In step D, the redundancy control unit RU determines if the requested address belongs to a defective memory cell of the memory array MA. If this is not the case, the flow continues with step E in which the addressed memory cell in the memory array MA is selected. In case the redundancy information indicates that the memory cell at the requested address is defective, the redundancy control unit RU addresses a corresponding memory cell in the redundancy array RA in step F.

After a memory cell in either the memory array MA or the redundancy array RA has been addressed, data can be transferred between the memory cell and the data bus DB in step G.

The above embodiment has been described using columns as redundancy elements. However, someone skilled in the art could also use redundancy elements that are rows or blocks or a combination of columns, rows and blocks.

It will further be apparent to those skilled in the art that various modifications and variations can be made to the structure and method of the present invention without departing from the scope or the spirit of the invention. In view of the foregoing, it is intended that the present invention covers modifications and variations of this invention provided they fall within the scope of the following claims and their equivalents.

What is claimed is:

1. A semiconductor memory device, comprising:
   a memory array having a plurality of memory cells;
   a redundancy array having a plurality of memory cells;
   a non-volatile redundancy information memory having a plurality of memory cells for storing redundancy information, wherein the memory cells in each column of the memory array are coupled to a same sense amplifier as at least one corresponding memory cell of the non-volatile redundancy information memory; and
   a redundancy control unit for selecting either memory cells in the memory array or memory cells in the redundancy array, wherein the non-volatile redundancy information memory is connected directly to the redundancy control unit by means of at least one sense amplifier.

2. The semiconductor memory device according to claim 1, wherein the memory cells in the memory array and the memory cells in the redundancy array are arranged in columns.

3. The semiconductor memory device according to claim 2, wherein the number of memory cells in the non-volatile redundancy information memory is greater than or equal to the number of columns of memory cells in the memory array.

4. The semiconductor memory device according to claim 3, wherein each memory cell in the non-volatile redundancy information memory is coupled to the redundancy control unit by means of a respective sense amplifier.

5. The semiconductor memory device according to claim 4, wherein the non-volatile redundancy information memory is part of the memory array.

6. The semiconductor memory device according to claim 1, wherein the redundancy control unit is coupled to control inputs of at least one bitline driver multiplexer and to control inputs of at least one sense amplifier multiplexer, wherein:
   the at least one bitline driver multiplexer couples a data bus to either a bitline driver of the memory array or to a bitline driver of the redundancy array; and
   the at least one sense amplifier multiplexer couples either a sense amplifier of the memory array or a sense amplifier of the redundancy array to the data bus.

7. The semiconductor memory device according to claim 1, wherein at least the memory cells of one of the memory array, the redundancy array and the non-volatile redundancy information memory are nitride read only memory cells.

8. A method for operating a semiconductor memory device, the method comprising:
   providing a memory array having a plurality of memory cells, a redundancy array having a plurality of memory cells, a non-volatile redundancy information memory having a plurality of memory cells for storing redundancy information, and a redundancy control unit;
   receiving an address;
   reading the redundancy information stored in the non-volatile redundancy information memory directly into the redundancy control unit by means of at least one sense amplifier; and
   selecting either a memory cell in the memory array or a memory cell in the redundancy array for one of a read, write and erase operation by means of the redundancy control unit and depending on the redundancy information that corresponds to the address received; and
   performing a memory operation comprising accessing the memory cell in the memory array with the at least one sense amplifier if the memory array is selected.

9. The method according to claim 8, wherein in the step of reading the redundancy information, the redundancy information is read out of the memory cells of the non-volatile redundancy information memory in parallel by respective sense amplifiers.

10. The method according to claim 8, further comprising transferring data between the selected memory cell and a data bus.

11. The method according to claim 10, wherein reading the redundancy information stored in the non-volatile redundancy information memory directly into the redundancy control unit comprises transferring redundancy information to the redundancy control unit without accessing the data bus.

12. A semiconductor memory device, comprising:
   a memory array having a plurality of memory cells;
   a redundancy array having a plurality of memory cells;
   a non-volatile redundancy information memory having a plurality of memory cells for storing redundancy information;
   a data bus;
   at least one sense amplifier, the at least one sense amplifier coupled to the memory array and the non-volatile redundancy information memory;
   access circuitry coupled between the memory array and the data bus and also between the redundancy array and the data bus; and
   a redundancy control unit coupled to the access circuitry, the redundancy control unit also being coupled to the non-volatile redundancy information memory through at least one line that is separate from the data bus.

13. The semiconductor memory device according to claim 12, wherein the at least one sense amplifier is coupled between the non-volatile redundancy information memory and the redundancy control unit in series with the at least one line.

14. The semiconductor memory device according to claim 12, wherein the access circuitry comprises a write driver multiplexer.

15. The semiconductor memory device according to claim 14, wherein the access circuitry further comprises a sense amplifier multiplexer.

16. The semiconductor memory device according to claim 14, further comprising:
   a write driver coupled between the write driver multiplexer and the memory array; and
   a redundant write driver coupled between the write driver multiplexer and the redundancy array.

17. The semiconductor memory device according to claim 12, wherein the access circuitry comprises a sense amplifier multiplexer.

18. The semiconductor memory device according to claim 17, further comprising a redundant sense amplifier coupled between the sense amplifier multiplexer and the redundancy array.

19. The semiconductor memory device according to claim 18, wherein the at least one sense amplifier is coupled between the sense amplifier multiplexer and the memory array.

20. The semiconductor memory device according to claim 12, wherein the memory array includes a plurality of nitride read only memory cells, the redundancy array includes a plurality of nitride read only memory cells, and the non-volatile redundancy information memory includes a plurality of nitride read only memory cells.

* * * * *